(12) United States Patent
Wallace et al.

(10) Patent No.: US 7,915,171 B2
(45) Date of Patent: Mar. 29, 2011

(54) DOUBLE PATTERNING TECHNIQUES AND STRUCTURES

(75) Inventors: Charles H. Wallace, Portland, OR (US); Matthew Tingey, Hillsboro, OR (US); Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 396 days.

(21) Appl. No.: 12/111,702

(22) Filed: Apr. 29, 2008

(65) Prior Publication Data

US 2009/0267175 A1 Oct. 29, 2009

(51) Int. Cl.
*H01L 21/306* (2006.01)
*G03F 1/00* (2006.01)

(52) U.S. Cl. .......................................... 438/694; 430/5

(58) Field of Classification Search .................. 438/694, 438/671; 430/5
See application file for complete search history.

(56) References Cited

U.S. PATENT DOCUMENTS

| | | | |
|---|---|---|---|
| 6,153,357 A * | 11/2000 | Okamoto et al. ............. 430/312 |
| 6,225,013 B1 * | 5/2001 | Cohen et al. .................... 430/30 |
| 6,329,118 B1 | 12/2001 | Hussein et al. |
| 6,365,529 B1 | 4/2002 | Hussein et al. |
| 6,406,995 B1 | 6/2002 | Hussein et al. |
| 6,649,515 B2 | 11/2003 | Moon et al. |
| 6,968,532 B2 | 11/2005 | Sivakumar et al. |
| 6,977,219 B2 | 12/2005 | Frost et al. |
| 7,015,136 B2 * | 3/2006 | Bao et al. ....................... 438/638 |
| 7,015,148 B1 * | 3/2006 | Lukanc et al. ................. 438/736 |
| 7,056,645 B2 | 6/2006 | Sivakumar et al. |
| 7,179,570 B2 | 2/2007 | Sivakumar et al. |
| 7,258,965 B2 | 8/2007 | Frost et al. |
| 7,265,431 B2 | 9/2007 | Sivakumar |
| 7,288,344 B2 | 10/2007 | Frost et al. |
| 7,374,865 B2 | 5/2008 | Nyhus et al. |
| 7,759,253 B2 * | 7/2010 | Chang ............................ 438/706 |
| 2003/0044734 A1 * | 3/2003 | Martin et al. .................. 430/394 |
| 2006/0046160 A1 | 3/2006 | Wallace et al. |
| 2008/0116439 A1 | 5/2008 | Dubin |
| 2008/0280215 A1 * | 11/2008 | Shin .................................... 430/5 |
| 2009/0217224 A1 * | 8/2009 | Wiaux et al. ....................... 716/5 |

OTHER PUBLICATIONS

Drapeau et al., "Double Patterning Design Split Implementation and Validation for the 32nm Node", Proceedings of SPIE, vol. 6521, Oct. 2007, pp. 652109-1 to pp. 652109-15.*
Wang et al., "Reducing imaging defects in high-resolution photolithography", Journal of Vacuum Science and Technology part B. vol. 26(1) Jan. 24, 2008, pp. L19-L22.*
U.S. Appl. No. 11/821,971, filed Jun. 26, 2007.
U.S. Appl. No. 11/820,420, filed Jun. 19, 2007.

* cited by examiner

*Primary Examiner* — W. David Coleman
(74) *Attorney, Agent, or Firm* — Cool Patent, P.C.; Joseph P. Curtin

(57) ABSTRACT

Double patterning techniques and structures are generally described. In one example, a method includes depositing a first photoresist to a semiconductor substrate, forming a first integrated circuit (IC) pattern in the first photoresist, the first IC pattern comprising one or more trench structures, protecting the first IC pattern in the first photoresist from actions that form a second IC pattern in a second photoresist, depositing the second photoresist to the first IC pattern, and forming the second IC pattern in the second photoresist, the second IC pattern comprising one or more structures that are sufficiently close to the one or more trench structures of the first IC pattern to cause scumming of the second photoresist in the one or more trench structures of the first IC pattern.

20 Claims, 5 Drawing Sheets

DOUBLE PATTERNING TECHNIQUES AND STRUCTURES

BACKGROUND

Generally, size scaling of integrated circuit (IC) structures may be limited by the resolution capability of lithography equipment used to resolve the IC structures. For example, single-patterning methods for transferring IC designs to a semiconductor substrate may be limited by at least optical or reflective resolution limits of steppers, scanners, or other associated patterning equipment.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
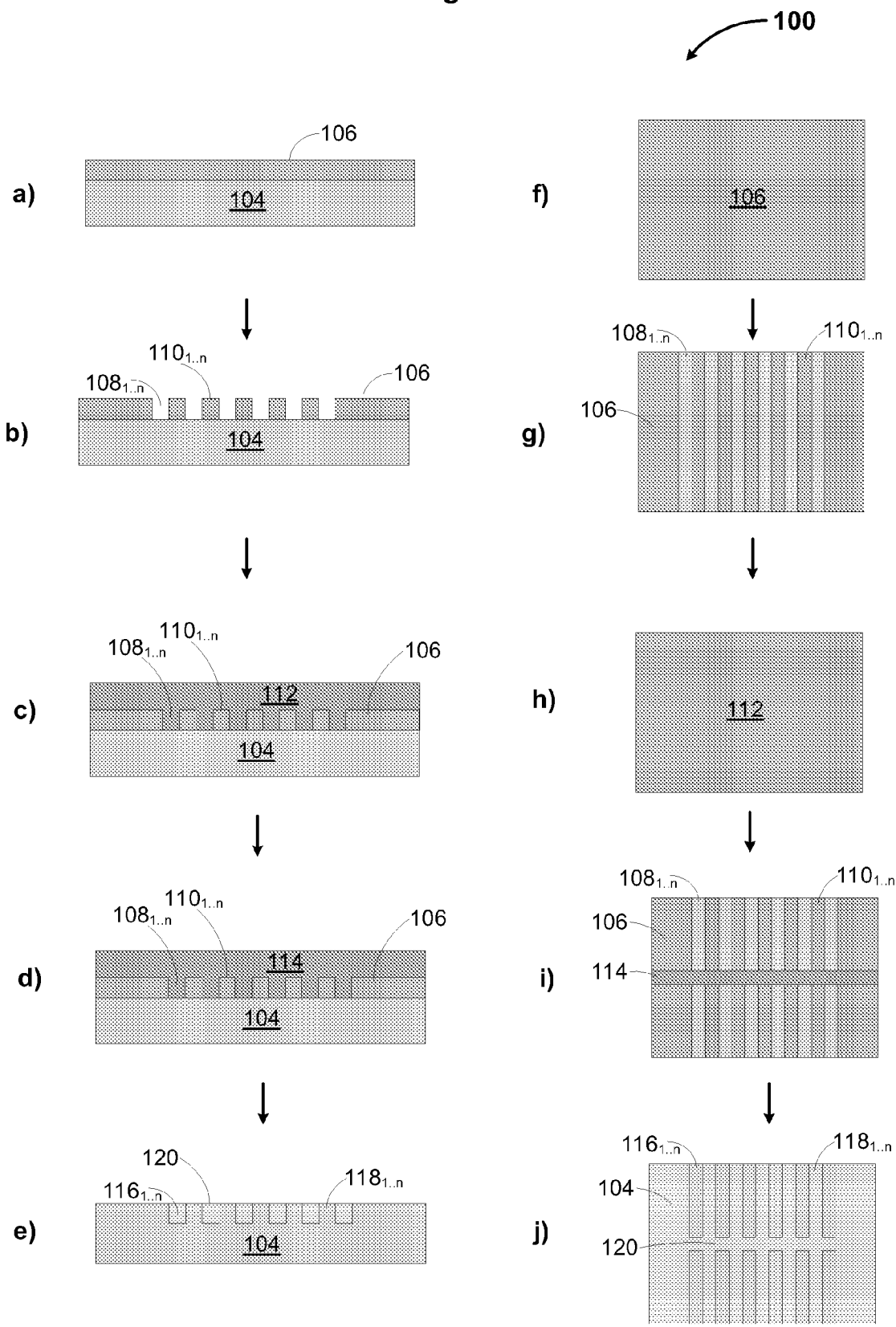
FIG. 1 is a schematic of double patterning techniques and structures, according to but one embodiment.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of double-patterning techniques and structures are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

FIG. 1 is a schematic of double-patterning techniques and structures, according to but one embodiment. In an embodiment, FIGS. 1a-1j depict fabrication of an electronic device 100 comprising double-patterning structures. FIGS. 1a-1e may depict an elevation cross-section process schematic for fabricating double-patterning structures and FIGS. 1f-1j may depict a plan-view cross-section process schematic for fabricating double-patterning structures. FIGS. 1f-1j may correspond with actions and/or structures described with respect to FIGS. 1a-1e, respectively, but from a different perspective for the sake of clarity. Arrows between FIGS. 1a-1j may suggest a process flow, according to one embodiment.

In an embodiment according to FIG. 1a, an electronic device 100 includes a semiconductor substrate 104 and a first photoresist 106, coupled as shown. Semiconductor substrate 104 may comprise silicon, group III-V semiconductor materials, group II-VI semiconductor materials, or combinations thereof, in one or more embodiments. In another embodiment, semiconductor substrate 104 comprises any suitable semiconductor material for fabricating an electronic device 100.

FIG. 1f may be a top-view depiction of an electronic device 100 similar to FIG. 1a. In an embodiment according to FIG. 1f, a first photoresist 106 may be deposited to cover an underlying semiconductor substrate 104. First photoresist 106 may include any suitable photoresist used to define integrated circuit (IC) patterns for an electronic device 100. First photoresist 106 may include, for example, positive or negative photoresists. In another embodiment, first photoresist 106 includes photoresists having high contrast and/or high resolution in light having wavelengths of about 248 nm, 193 nm and/or extreme ultraviolet (EUV) light wavelengths. First photoresist 106 is not necessarily limited in this regard and may include photoresists that are activated by other wavelengths in other embodiments.

Although a first photoresist 106 is deposited directly to a semiconductor substrate 104 in FIG. 1a, a first photoresist 106 may be deposited to other structures of an electronic device 100. Double-patterning structures, as described herein, may be formed, for example, by depositing a first photoresist 106 to layers and/or other structures formed on the semiconductor substrate 104. In an embodiment, double-patterning structures are used to form IC structures of a transistor region of an electronic device 100. In another embodiment, double-patterning structures are used to form IC structures of an interconnect region of an electronic device 100.

In an embodiment according to FIG. 1b, a first IC pattern $108_{1...n}, 110_{1...n}$ is formed in the first photoresist 106, in which n is an integer that represents a number of repeating structures. A first IC pattern may comprise one or more trench structures $108_{1...n}$. In another embodiment, A first IC pattern comprises one or more line structures $110_{1...n}$. A trench structure $108_{1...n}$ may include any structure wherein first photoresist material 106 has been removed to expose an underlying material such as semiconductor substrate 104. A line structure $110_{1...n}$ may include any structure wherein first photoresist material 106 has not been removed.

FIG. 1g may be a top-view depiction of an electronic device 100 similar to FIG. 1b. In an embodiment, a first IC pattern $108_{1...n}, 110_{1...n}$ comprises a grating pattern. A grating pattern may comprise multiple trench structures $108_{1...n}$ and multiple line structures $110_{1...n}$ arranged in an alternating fashion as depicted. In an embodiment, the distance or pitch between repeating structures $108_{1...n}, 110_{1...n}$ is less than about 80 nanometers (nm). Other scales of size or pitch may be used in other embodiments.

A first IC pattern $108_{1...n}, 110_{1...n}$ may be formed in the first photoresist 106 by an expose and develop process. In an embodiment, the first photoresist 106 is exposed to light energy to define the first IC pattern $108_{1...n}, 110_{1...n}$ in the first photoresist 106. Developer may remove either the exposed or unexposed regions of the first photoresist 106. In an embodiment in which the first photoresist 106 is a positive photoresist, exposed first photoresist 106 is removed by dissolving and removing the exposed first photoresist 106 with a developer solution. In an embodiment in which the first photoresist 106 is a negative photoresist, unexposed first photoresist 106 is removed by dissolving and removing the unexposed first photoresist 106 with a developer solution. In other embodiments, any suitable lithography or other patterning process is used to form a first IC pattern $108_{1...n}$, $110_{1...n}$ in the first photoresist 106.

The first IC pattern $108_{1...n}$, $110_{1...n}$ in the first photoresist 106 may be protected from actions or processes that form a second IC pattern 114 in a second photoresist 112. A first IC pattern $108_{1...n}$, $110_{1...n}$ may be protected by making the first IC pattern $108_{1...n}$, $110_{1...n}$ impervious to exposure of light energy that may define the second IC pattern 114, or making the first IC pattern $108_{1...n}$, $110_{1...n}$ in the first photoresist 106 insoluble to developer and/or solvent that may remove either exposed or unexposed regions of the second photoresist 112, or combinations thereof. In an embodiment, a first IC pattern $108_{1...n}$, $110_{1...n}$ is made insoluble in developers and solvents that may be used to form a second IC pattern 114. In an embodiment, a first IC pattern $108_{1...n}$, $110_{1...n}$ is made insoluble in developers comprising, for example, tetramethyl ammonium hydroxide (TMAH) and/or solvents comprising, for example, ethyl lactate, propylene glycol methyl ether acetate (PGMEA), or cyclohexanone, or combinations thereof. Other developers and/or solvents may be used in other embodiments.

In an embodiment, protecting the first photoresist 106 is referred to as "freezing" the first photoresist 106. The first IC pattern $108_{1...n}$, $110_{1...n}$ in the first photoresist 106 may be frozen or protected, for example, by coating the first IC pattern $108_{1...n}$, $110_{1...n}$ with a protective shell. A protective shell may be formed by forming cross-links at the surface of the first IC pattern $108_{1...n}$, $110_{1...n}$ either chemically, or by exposure, or combinations thereof. Other suitable methods for protecting the first photoresist 106 from processes associated with the formation of a second IC pattern 114 may be used in other embodiments.

In an embodiment according to FIG. 1c, a second photoresist 112 is deposited to the first IC pattern $108_{1...n}$, $110_{1...n}$ and/or the semiconductor substrate 104. Second photoresist 112 may be deposited to the first IC pattern $108_{1...n}$, $110_{1...n}$ and/or the semiconductor substrate 104 by any suitable deposition method. FIG. 1h may depict a top-down view of an electronic device 100 similar to FIG. 1c. Second photoresist 112 may be deposited to cover the underlying first IC pattern $108_{1...n}$, $110_{1...n}$ Second photoresist 112 may be chemically equivalent or substantially similar to a first photoresist 106 or may be a different photoresist altogether.

Second photoresist 112 may include any suitable photoresist used to define integrated circuit (IC) patterns for an electronic device 100. Second photoresist 112 may include, for example, positive or negative photoresists. In another embodiment, second photoresist 112 includes photoresists having high contrast and/or high resolution in light having wavelengths of about 248 nm, 193 nm and/or extreme ultraviolet (EUV) light wavelengths. Second photoresist 112 is not necessarily limited in this regard and may include photoresists that are activated by other wavelengths in other embodiments.

In an embodiment according to FIG. 1d, a second IC pattern 114 is formed in the second photoresist 112. FIG. 1i may be a top-down depiction of FIG. 1d to provide another perspective of the second IC pattern 114. A second IC pattern 114 may be formed in the second photoresist 112 by an expose and develop process. In an embodiment, the second photoresist 112 is exposed to light energy to define the second IC pattern 114 in the second photoresist 112. Developer may remove either the exposed or unexposed regions of the second photoresist 112. In an embodiment in which the second photoresist 112 is a positive photoresist, exposed second photoresist 112 is removed by dissolving and removing the exposed second photoresist 112 with a developer solution. In an embodiment in which the second photoresist 112 is a negative photoresist, unexposed second photoresist 112 is removed by dissolving and removing the unexposed second photoresist 112 with a developer solution. In other embodiments, any suitable lithography or other patterning process is used to form a second IC pattern 114 in the second photoresist 112.

Placement of the second IC pattern 114 in sufficient proximity to the underlying first IC pattern $108_{1...n}$, $110_{1...n}$ may cause scumming or incomplete exposure and/or development of the second IC pattern 114. Scumming may comprise chemical affinity or surface interactions, including, for example, hydrogen bonding between the first IC pattern $108_{1...n}$, $110_{1...n}$ and second IC pattern 114. Such scumming may enhance the patterning process by mechanically supporting and/or chemically anchoring the second IC pattern 144 allowing smaller patterns to be formed. In an embodiment, the second IC pattern 114 comprises one or more structures that are sufficiently close to the one or more trench structures $108_{1...n}$ of the first IC pattern $108_{1...n}$, $110_{1...n}$ to cause scumming of the second photoresist 112 or the second IC pattern 114 in the one or more trench structures $108_{1...n}$ of the first IC pattern $108_{1...n}$, $110_{1...n}$.

Surface treatments may be used to modulate the amount of scumming that occurs. For example, surface adhesion properties and/or optical properties of surfaces of semiconductor substrate 104 and/or first IC pattern $108_{1...n}$, $110_{1...n}$ may be treated to modulate the extent of scumming. In an embodiment, a material such as hexamethyldisilazane (HMDS) or functionally similar material may be deposited to increase surface adhesion for common photoresists. Other surface treatments including, for example, introducing water, acids, bases, or depositing films or monolayers may also be employed to modulate the amount of scumming. The pH of the surface of first IC pattern $108_{1...n}$, $110_{1...n}$ may be altered to increase or decrease the adhesion of a second IC pattern 114 to the first IC pattern $108_{1...n}$, $110_{1...n}$. In an embodiment, the surface of first IC pattern $108_{1...n}$, $110_{1...n}$ is terminated, for example, with an amine group to increase adhesion of acidic photoresists. Other analogous treatments based on this principle may be used in other embodiments. Such modification of first IC pattern $108_{1...n}$, $110_{1...n}$ may be performed as part of protecting the first IC pattern $108_{1...n}$.

Altering optical properties, such as absorbance, index of refraction, or reflectivity, or combinations thereof, of semiconductor substrate 104 and/or first IC pattern $108_{1...n}$, $110_{1...n}$ may also modulate the amount of scumming. In an embodiment, an amount of scumming sufficient to form one or more IC structures $116_{1...n}$, $118_{1...n}$, 120 in a semiconductor substrate 104 or other semiconductor structure from double-patterning structures $108_{1...n}$, $110_{1...n}$, 114 is controllable and repeatable.

Double-patterning techniques combined with induced scumming may exploit the contrast and dissolution properties of common photoresists to increase the resolution capabilities of current patterning equipment. For example, at the lower contrast limits of high contrast photoresist materials, the resolution of small trenches or spaces $108_{1...n}$ may be difficult due to inadequate light energy or difficulty in dissolving activated photoresist in small trenches or spaces $108_{1...n}$.

Smaller IC patterns $108_{1...n}$, $110_{1...n}$, 114 and thus smaller IC structures $116_{1...n}$, $118_{1...n}$, 120 may be achievable with an induced scumming effect. Scumming, for example, may prevent the second IC pattern 114 from falling over and/or from being removed by developer. In contrast, without scumming, structures of the same size as the one or more structures of the second IC pattern 114 may typically collapse, experience severe top-loss, or may not be of sufficient height to effectively block subsequent etch processes. In an embodiment, scumming allows the fabrication of smaller IC structures $116_{1...n}$, $118_{1...n}$, 120 on or in the semiconductor substrate 104 than without scumming by preventing the removal of the one or more structures of the second IC pattern 114 or by anchoring the one or more structures of the second IC pattern 114, or combinations thereof, during formation of the second IC pattern 114.

A second IC pattern 114 with induced scumming may increase an overlay process window by self-aligning or preferentially filling up the one or more trench structures $108_{1...n}$ of the first IC pattern $108_{1...n}$, $110_{1...n}$. For example, second IC pattern 114 in the one or more trench structures $108_{1...n}$ of the first IC pattern $108_{1...n}$, $110_{1...n}$ may be more difficult to expose and/or dissolve with developer. In an embodiment, a second IC pattern 114 is centered over a trench $108_{1...n}$ to fill or plug the trench. In other embodiments, a second IC pattern 114 is placed close enough to a trench $108_{1...n}$ to cause scumming of the trench. Scumming is further described with respect to FIG. 4.

In an embodiment according to FIG. 1e, a composite pattern comprising the first IC pattern $108_{1...n}$, $110_{1...n}$ and the second IC pattern 114 is etched into the semiconductor substrate 104 to form one or more IC structures $116_{1...n}$, $118_{1...n}$, 120. In other embodiments, a composite pattern comprising a first IC pattern $108_{1...n}$, $110_{1...n}$ and the second IC pattern 114 is etched into a layer or other structure formed on the semiconductor substrate 104 including, for example, dielectric layers or interconnect layers. Etching the one or more trench structures $108_{1...n}$ in the first photoresist 106 may create one or more trench structures $116_{1...n}$ in the underlying semiconductor substrate 104. The one or more line structures $110_{1...n}$ of the first IC pattern and the second IC pattern 114 may prevent etching of the semiconductor substrate 104 resulting in line structures $118_{1...n}$, 120 in or on the semiconductor substrate 104. Any remaining first photoresist 106 and/or second photoresist 112 may be removed by a resist strip process, other etch clean processes, or any suitable photoresist removal process.

FIG. 1j may be a top-down depiction of an electronic device 100 similar to FIG. 1e. A second IC pattern 114 may form a termination structure 120 to one or more trench structures $116_{1...n}$ after etching. Double-patterning as described herein may allow the patterning of IC structures that traditionally limit size scaling including, for example, two dimensional structures at tight pitches, or structures with high mask error enhancement factor (MEEF), or combinations thereof, but is not necessarily limited in this regard, and may be used to form any IC structure.

Some example structures that may be at or near the limits of lithography resolution include line-end or trench-end structures, line end-to-end or trench end-to-end structures, bends or corners in lines or trench structures, or any other attacker geometry structure. An example attacker geometry is depicted with respect to FIG. 3b. In an embodiment, FIG. 1j depicts an electronic device 100 comprising one or more trench end-to-end structures $116_{1...n}$, in which the ends of the trenches $116_{1...n}$ are separated by structure 120 formed by double-patterning techniques as described herein. Composite patterns may include a grating pattern and a line-end or trench-end structure, or a trench end-to-end or line end-to-end structure, or an attacker geometry structure, or combinations thereof. In an embodiment, an electronic device 100 comprises one or more IC structures, the one or more IC structures comprising a grating pattern and a line-end or trench-end structure, or a trench end-to-end or line end-to-end structure, or an attacker geometry structure, or combinations thereof, formed by double-patterning techniques described herein.

In an embodiment, an electronic device 100 includes a semiconductor substrate 104, and one or more integrated circuit (IC) structures $116_{1...n}$, $118_{1...n}$, 120 coupled with the semiconductor substrate 104. The one or more IC structures $116_{1...n}$, $118_{1...n}$, 120 may be formed according to double-patterning techniques disclosed herein. One or more IC structures $116_{1...n}$, $118_{1...n}$, 120 may be formed on other layers and/or structures that are formed on the semiconductor substrate 104. In this regard, the one or more IC structures $116_{1...n}$, $118_{1...n}$, 120 are also coupled with the semiconductor substrate 104 through the intervening layers and/or structures.

Figure 2:
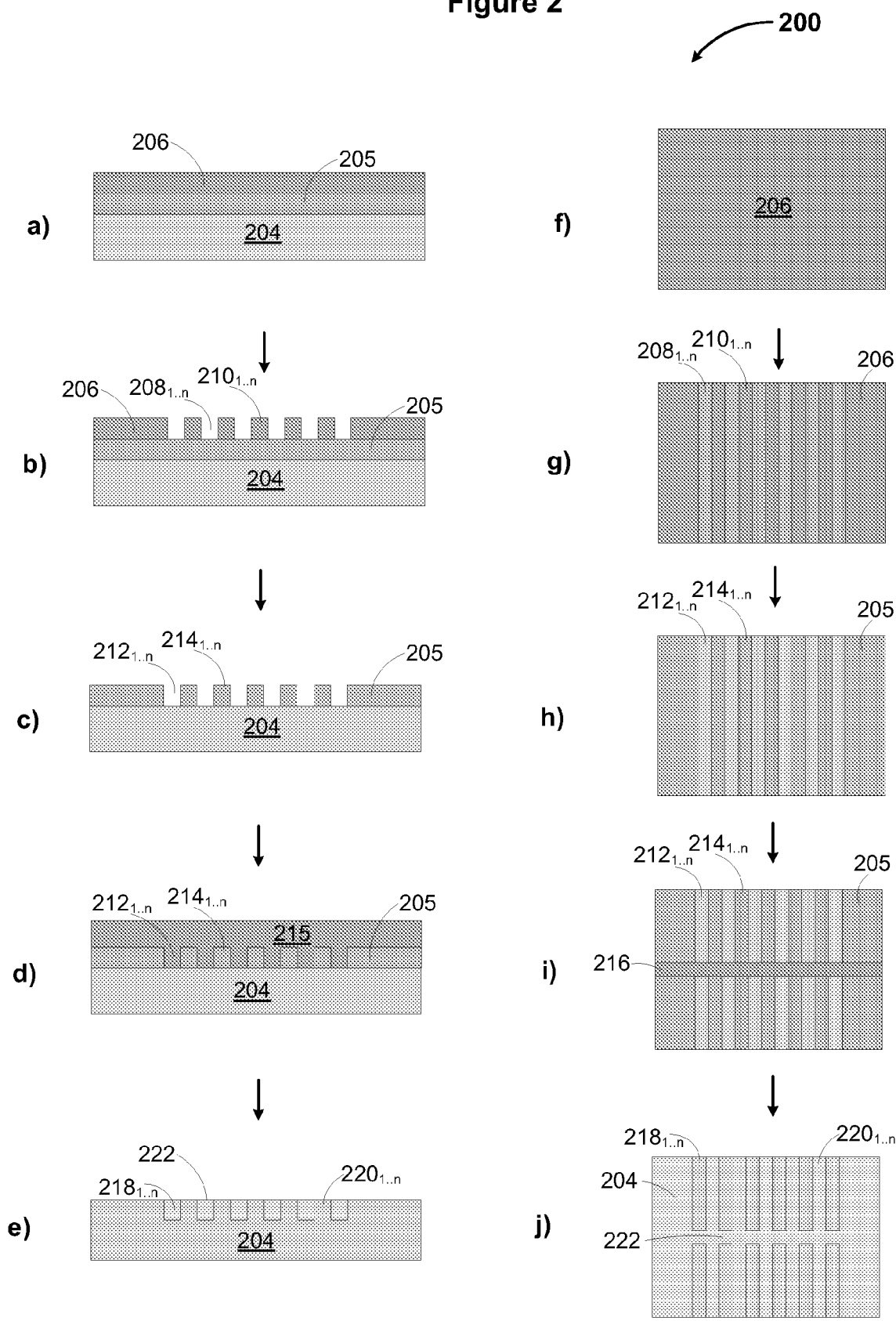
FIG. 2 is another schematic of double patterning techniques and structures, according to but one embodiment.

FIG. 2 is another schematic of double-patterning techniques and structures, according to but one embodiment. In an embodiment, FIGS. 2a-2j depict fabrication of another electronic device 200 comprising double-patterning structures. FIGS. 2a-2e may depict an elevation cross-section process schematic for fabricating double-patterning structures and FIGS. 2f-2j may depict a plan-view cross-section process schematic for fabricating double-patterning structures. FIGS. 2f-2j may correspond with actions and/or structures described with respect to FIGS. 2a-2e, respectively, but from a different perspective for the sake of clarity. Arrows between FIGS. 2a-2j may suggest a process flow, according to one embodiment.

In an embodiment according to FIG. 2a, an electronic device 200 includes a semiconductor substrate 204, a sacrificial layer 205, and a first photoresist 206, coupled as shown. A first photoresist 206 may be deposited to a sacrificial layer 205, the sacrificial layer 205 being coupled with the semiconductor substrate 204. Semiconductor substrate 204 may comprise, for example, silicon, group III-V semiconductor materials, group II-VI semiconductor materials, or combinations thereof, in one or more embodiments. In another embodiment, semiconductor substrate 204 comprises any suitable semiconductor material for fabricating an electronic device 200. Sacrificial layer 205 may comprise a hardmask layer including, for example, materials comprising polymeric carbon, graphitic carbon, silicon nitride, silicon oxynitride, titanium, titanium nitride, silicon carbide, or silicon oxide, or combinations thereof.

FIG. 2f may be a top-view depiction of an electronic device 200 similar to FIG. 2a. In an embodiment according to FIG. 2f, a first photoresist 206 may be deposited to cover an underlying sacrificial layer 205. A first photoresist 206 may include any suitable photoresist used to define integrated circuit (IC) patterns for an electronic device 200. A first photoresist 206 may include, for example, positive or negative photoresists. In another embodiment, a first photoresist 206 includes photoresists having high contrast and/or high resolution in light having wavelengths of about 248 nm, 193 nm and/or extreme ultraviolet (EUV) light wavelengths. A first photoresist 206 is not necessarily limited in this regard and may include, for example, photoresists that are activated by other wavelengths in other embodiments.

In an embodiment according to FIG. 2b, a first IC pattern $208_{1...n}$, $210_{1...n}$ is formed in the first photoresist 206, in which n is an integer that represents a number of repeating structures. A first IC pattern may, for example, comprise one or more trench structures $208_{1...n}$. In another embodiment, a first IC pattern comprises one or more line structures $210_{1...n}$.

FIG. 2g may be a top-view depiction of an electronic device 200 similar to FIG. 2b. In an embodiment, a first IC pattern $208_{1...n}$, $210_{1...n}$ comprises a grating pattern. A grating pattern may comprise multiple trench structures $208_{1...n}$ and multiple line structures $210_{1...n}$ arranged in an alternating fashion as depicted. In an embodiment, the pitch between repeating structures $208_{1...n}$, $210_{1...n}$ is less than about 80 nanometers (nm). Other scales of size or pitch may be used in other embodiments.

A first IC pattern $208_{1...n}$, $210_{1...n}$ may be formed in the first photoresist 206 by an expose and develop process. In an embodiment, the first photoresist 206 is exposed to light energy to define the first IC pattern $208_{1...n}$, $210_{1...n}$ in the first photoresist 206. Developer may remove either the exposed or unexposed regions of the first photoresist 206. In other embodiments, any suitable lithography or other patterning process is used to form a first IC pattern $208_{1...n}$, $210_{1...n}$ in the first photoresist 206.

In an embodiment according to FIG. 2c, a first IC pattern $208_{1...n}$, $210_{1...n}$ may be transferred to the sacrificial layer 205 by an etch process. A first IC pattern comprising trench structures $212_{1...n}$ and/or line structures $214_{1...n}$ may be etched into the sacrificial layer 205. As depicted in the top-view of FIG. 1h, a grating pattern of trench structures $212_{1...n}$ and line structures $214_{1...n}$ is formed in the sacrificial layer 205. Any remaining first photoresist 206 after the first IC pattern $208_{1...n}$, $210_{1...n}$ is etched into the sacrificial layer 205 may be removed by a resist strip process, an etch cleans process, or any other suitable method. A bottom anti-reflective coating (BARC) may be deposited to the semiconductor substrate 204 and/or the first IC pattern $212_{1...n}$, $214_{1...n}$ in the sacrificial layer 205 prior to forming a second IC pattern 216.

In an embodiment according to FIG. 2d, a second photoresist 215 may be deposited to the first IC pattern $212_{1...n}$, $214_{1...n}$ etched in the sacrificial layer 205 by any suitable deposition method. A second photoresist 215 may include any suitable photoresist used to define integrated circuit (IC) patterns for an electronic device 200. Second photoresist 215 may include, for example, positive or negative photoresists. In another embodiment, second photoresist 215 includes photoresists having high contrast and/or high resolution in light having wavelengths of about 248 nm, 193 nm and/or extreme ultraviolet (EUV) light wavelengths. Second photoresist 215 is not necessarily limited in this regard and may include photoresists that are activated by other wavelengths in other embodiments. A second photoresist 215 may be chemically equivalent or substantially similar to a first photoresist 206 or may be a different photoresist altogether.

In an embodiment according to FIG. 2i, a second IC pattern 216 is formed in the second photoresist 215. A second IC pattern 216 may be formed in the second photoresist 215 by an expose and develop process. In an embodiment, the second photoresist 215 is exposed to light energy to define the second IC pattern 216 in the second photoresist 215. Developer may remove either the exposed or unexposed regions of the second photoresist 215. In other embodiments, any suitable lithography or other patterning process is used to form a second IC pattern 216 in the second photoresist 215. In an embodiment, forming a second IC pattern 216 in the second photoresist 215 does not substantially alter the first IC pattern $212_{1...n}$, $214_{1...n}$ in the sacrificial layer 205.

Placement of the second IC pattern 216 in sufficient proximity to the underlying first IC pattern $212_{1...n}$, $214_{1...n}$ may cause scumming or incomplete exposure and/or development of the second IC pattern 216. Such scumming may enhance the patterning process by chemically anchoring or mechanically buttressing the second IC pattern 216 allowing smaller patterns to be formed. In an embodiment, the second IC pattern 216 comprises one or more structures that are sufficiently close to the one or more trench structures $212_{1...n}$ of the first IC pattern $212_{1...n}$, $214_{1...n}$ to cause scumming of the second photoresist 215 or the second IC pattern 216 in the one or more trench structures $212_{1...n}$ of the first IC pattern $212_{1...n}$, $214_{1...n}$.

Double-patterning techniques combined with induced scumming may allow the formation of smaller IC structures $218_{1...n}$, $220_{1...n}$, 222 in an electronic device 200 according to effects already described herein with respect to FIG. 1. In an embodiment, scumming allows the fabrication of smaller IC structures $218_{1...n}$, $220_{1...n}$, 222 on or in the semiconductor substrate 204 than without scumming by preventing the removal of the one or more structures of the second IC pattern 216 or by anchoring the one or more structures of the second IC pattern 216, or combinations thereof, during formation of the second IC pattern 216.

Altering optical properties, such as absorbance, index of refraction, or reflectivity, or combinations thereof, of semiconductor substrate 204 and/or first IC pattern $212_{1...n}$, $214_{1...n}$ may modulate the amount of scumming. In an embodiment, an amount of scumming sufficient to form one or more IC structures $218_{1...n}$, $220_{1...n}$, 222 in a semiconductor substrate 204 or other semiconductor structure from double-patterning structures $212_{1...n}$, $214_{1...n}$, 216 is controllable and repeatable.

A second IC pattern 216 with induced scumming may increase an overlay process window by self-aligning or preferentially filling up the one or more trench structures $212_{1...n}$ of the first IC pattern $212_{1...n}$, $214_{1...n}$. For example, second IC pattern 216 in the one or more trench structures $212_{1...n}$ of the first IC pattern $212_{1...n}$, $214_{1...n}$ may be more difficult to expose and/or dissolve with developer. In an embodiment, a second IC pattern 216 is centered over a trench $212_{1...n}$ to fill or plug the trench. In other embodiments, a second IC pattern 216 is placed close enough to a trench $212_{1...n}$ to cause scumming of the trench.

In an embodiment according to FIG. 2e, a composite pattern comprising the first IC pattern $212_{1...n}$, $214_{1...n}$ and the second IC pattern 216 is etched into the semiconductor substrate 204 to form one or more IC structures $218_{1...n}$, $220_{1...n}$, 222. Etching a composite pattern $212_{1...n}$, $214_{1...n}$, 216 may comprise an etch process that is selective to the second photoresist 215 or second IC pattern 216 and the sacrificial layer 205.

In other embodiments, a composite pattern comprising a first IC pattern $212_{1...n}$, $214_{1...n}$ and the second IC pattern 216 is etched into a layer or other structure formed on the semiconductor substrate 204 including, for example, dielectric layers or interconnect layers. Etching the one or more trench structures $212_{1...n}$ in the sacrificial layer 205 may create one or more trench structures $218_{1...n}$ in the underlying semiconductor substrate 204. The one or more line structures $214_{1...n}$ of the first IC pattern and the second IC pattern 216 may prevent etching of the semiconductor substrate 204 resulting in line structures $220_{1...n}$, 222 in or on the semiconductor substrate 204. Any remaining first sacrificial layer 205, second photoresist 215 and/or second IC pattern 216 may be removed by a resist strip process, other etch clean processes, or any suitable photoresist removal process.

FIG. 2*j* may be a top-down depiction of an electronic device 200 similar to FIG. 2*e*. A second IC pattern 216 may form a termination structure 222 to one or more trench structures $218_{1...n}$ after etching. Double-patterning as described herein may allow the patterning of IC structures $218_{1...n}$, $220_{1...n}$, 222 that traditionally limit size scaling including, for example, two dimensional structures at tight pitches, or structures with high mask error enhancement factor (MEEF), or combinations thereof.

In an embodiment, FIG. 2*j* depicts an electronic device 200 comprising one or more trench end-to-end structures $218_{1...n}$, in which the ends of the trenches $218_{1...n}$ are separated by structure 222 formed by double-patterning techniques as described herein. Composite patterns of a first IC pattern and a second IC pattern may include, for example, a grating pattern and a line-end or trench-end structure, or a trench end-to-end or line end-to-end structure, or an attacker geometry structure, or combinations thereof. In an embodiment, an electronic device 200 comprises one or more IC structures, the one or more IC structures comprising a grating pattern and a line-end or trench-end structure, or a trench end-to-end or line end-to-end structure, or an attacker geometry structure, or combinations thereof, formed by double-patterning techniques described herein.

In an embodiment, an electronic device 200 includes a semiconductor substrate 204, and one or more integrated circuit (IC) structures $218_{1...n}$, $220_{1...n}$, 222 coupled with the semiconductor substrate 204. The one or more IC structures $218_{1...n}$, $220_{1...n}$, 222 may be formed according to double-patterning techniques disclosed herein. One or more IC structures $218_{1...n}$, $220_{1...n}$ 222 may be formed on other layers and/or structures that are formed on the semiconductor substrate 204. In this regard, the one or more IC structures $218_{1...n}$, $220_{1...n}$, 222 are also coupled with the semiconductor substrate 204 through the intervening layers and/or structures. Techniques and structures described with respect to FIG. 2 may include embodiments already described with respect to FIG. 1.

Figure 3:
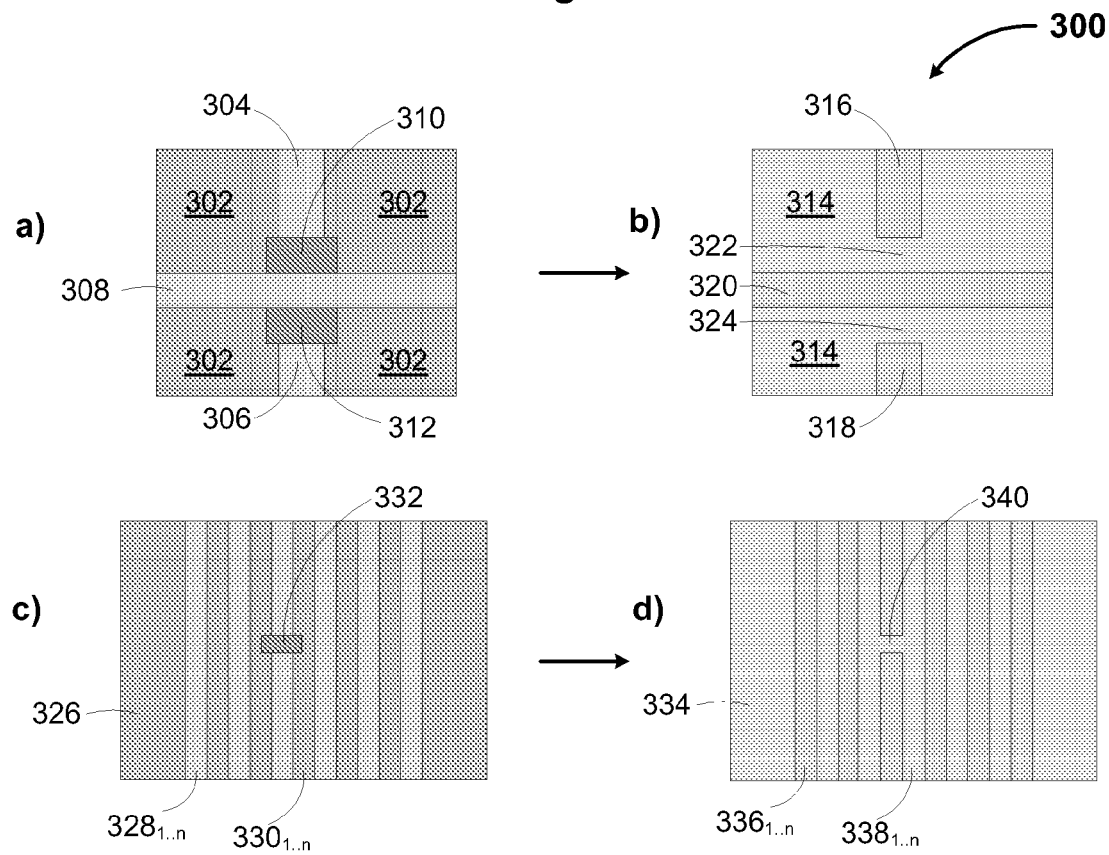
FIG. 3 is yet another schematic of double patterning techniques and structures, according to but one embodiment.

FIG. 3 is yet another schematic of doubled-patterning techniques and structures, according to but one embodiment. FIGS. 3*a*-3*b* may depict a top-view of fabricating an attacker geometry structure using double-patterning as disclosed herein. Attacker geometry may include two-dimensional structures including T-shaped structures, bends, or other analagous structures. FIGS. 3*c*-3*d* may depict a top-view of fabricating a single trench end-to-end structure using double-patterning as disclosed herein.

In an embodiment according to FIG. 3*a*, an electronic device 300 comprises a first photoresist 302 wherein a first IC pattern comprising trench structures 304, 306, 308 is formed therein. A second photoresist may be patterned to form a second IC pattern comprising structures 310, 312 to fill or plug the trench structures 304, 306 as depicted. A second IC pattern 310, 312 may induce scumming in the trench structures 304, 306 according to embodiments described herein.

In an embodiment according to FIG. 3*b*, an etch process may be used to transfer the composite pattern of FIG. 3*a* to an underlying layer or structure 314. In an embodiment, the underlying layer or structure 314 comprises a semiconductor substrate. An etch process may form one or more trench structures 316, 318, 320 in a layer or structure 314 underlying the first photoresist 302 of FIG. 3*a* wherein trench structure 316 is terminated with structure 322 and trench structure 318 is terminated with structure 324.

In an embodiment according to FIG. 3*c*, an electronic device 300 comprises a first photoresist 326 wherein a first IC pattern comprising trench structures $328_{1...n}$ and line structures $330_{1...n}$ are formed therein. A second photoresist may be patterned to form a second IC pattern 332 to fill one of the trench structures $328_{1...n}$ as depicted. A second IC pattern 332 may induce scumming in the filled trench structure $328_{1...n}$ according to embodiments described herein. Although second IC pattern 332 is depicted as centered over a trench structure $328_{1...n}$, a second IC pattern may be effective if slightly misaligned or off-center because the second photoresist of the second IC pattern may preferentially fill up the trench structure $328_{1...n}$ allowing for a larger overlay process window.

In an embodiment according to FIG. 3*d*, an etch process may be used to transfer the composite pattern of FIG. 3*c* to an underlying layer or structure 334. In an embodiment, the underlying layer or structure 334 comprises a semiconductor substrate. Etching the composite pattern of FIG. 3*c* may form one or more $336_{1...n}$ trench structures and one or more line structures $338_{1...n}$ in a layer or structure 334 underlying the first photoresist 326 of FIG. 3*c*. Etching the second IC pattern 332 may form a structure 340 that forms a trench end-to-end arrangement.

Figure 4:
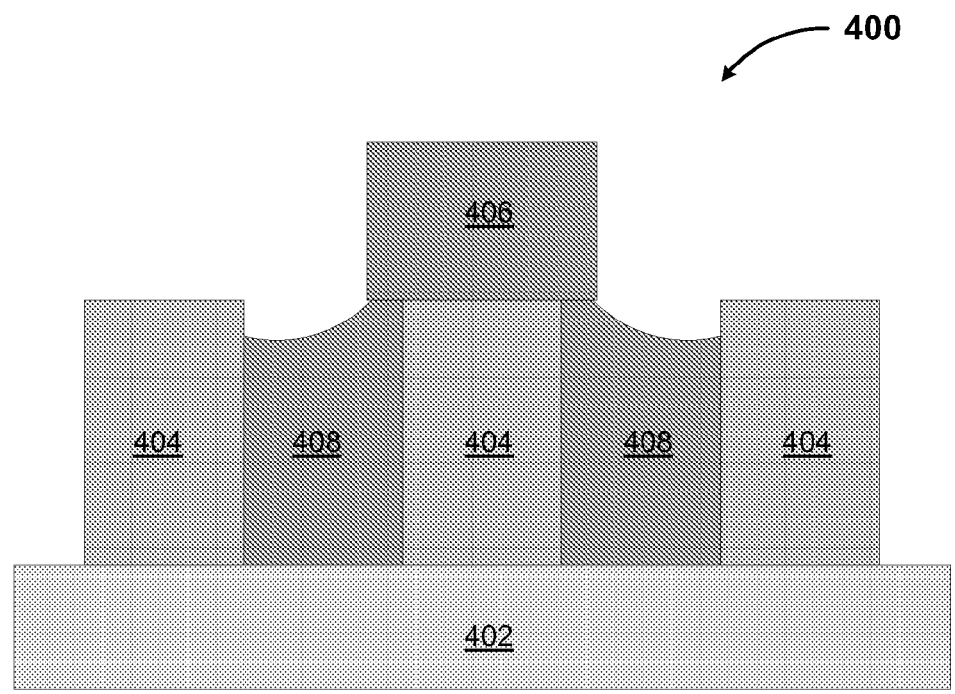
FIG. 4 depicts a double patterning technique comprising scumming, according to but one embodiment.

FIG. 4 depicts a double-patterning technique comprising scumming, according to but one embodiment. In an embodiment, FIG. 4 provides an elevation cross-section schematic of a layer or structure 402 of a semiconductor device 400, one or more structures of a first IC pattern 404 in a first photoresist, a structure of a second IC pattern 406 in a second photoresist, and trenches that are plugged or filled with scummed second photoresist 408.

A second photoresist may scum 408 or create a significant "foot" when patterned over tight spaces such as, for example, the spaces between line structures of first IC pattern 404. Scumming 408 may be caused by incomplete development of exposed photoresist in tight spaces, an optical shadowing effect from a refractive index mismatch between a first IC pattern 404 and a second IC pattern 406, or a chemical surface affinity of the second IC pattern 406 and the first IC pattern 404, or combinations thereof. Traditionally, scumming 408 of photoresist is considered detrimental and avoided in patterning methods. In the present disclosure, however, such scumming 408 when combined with double-patterning may enhance the patterning process by at least chemically or mechanically anchoring or buttressing the second IC pattern 406 allowing smaller patterns to be formed.

Double-patterning techniques combined with induced scumming 408 may exploit the contrast and dissolution properties of common photoresists to increase the resolution capabilities of current patterning equipment. Scumming 408, for example, may prevent the second IC pattern 406 from falling over and/or from being removed by developer. In contrast, without scumming 408, structures of the same size as the one or more structures of the second IC pattern 406 may typically collapse, experience severe top-loss, or may not be of sufficient height to effectively block subsequent etch processes. In an embodiment, scumming 408 is chemically and/or mechanically anchored, buttressed, or supported by the first IC pattern 404. In an embodiment, scumming 408 allows the fabrication of smaller IC structures on or in a semiconductor substrate 402 than without scumming by preventing the removal of the one or more structures of the second IC pattern 406 or by anchoring or buttressing the one or more structures of the second IC pattern 406, or combinations thereof.

Figure 5:
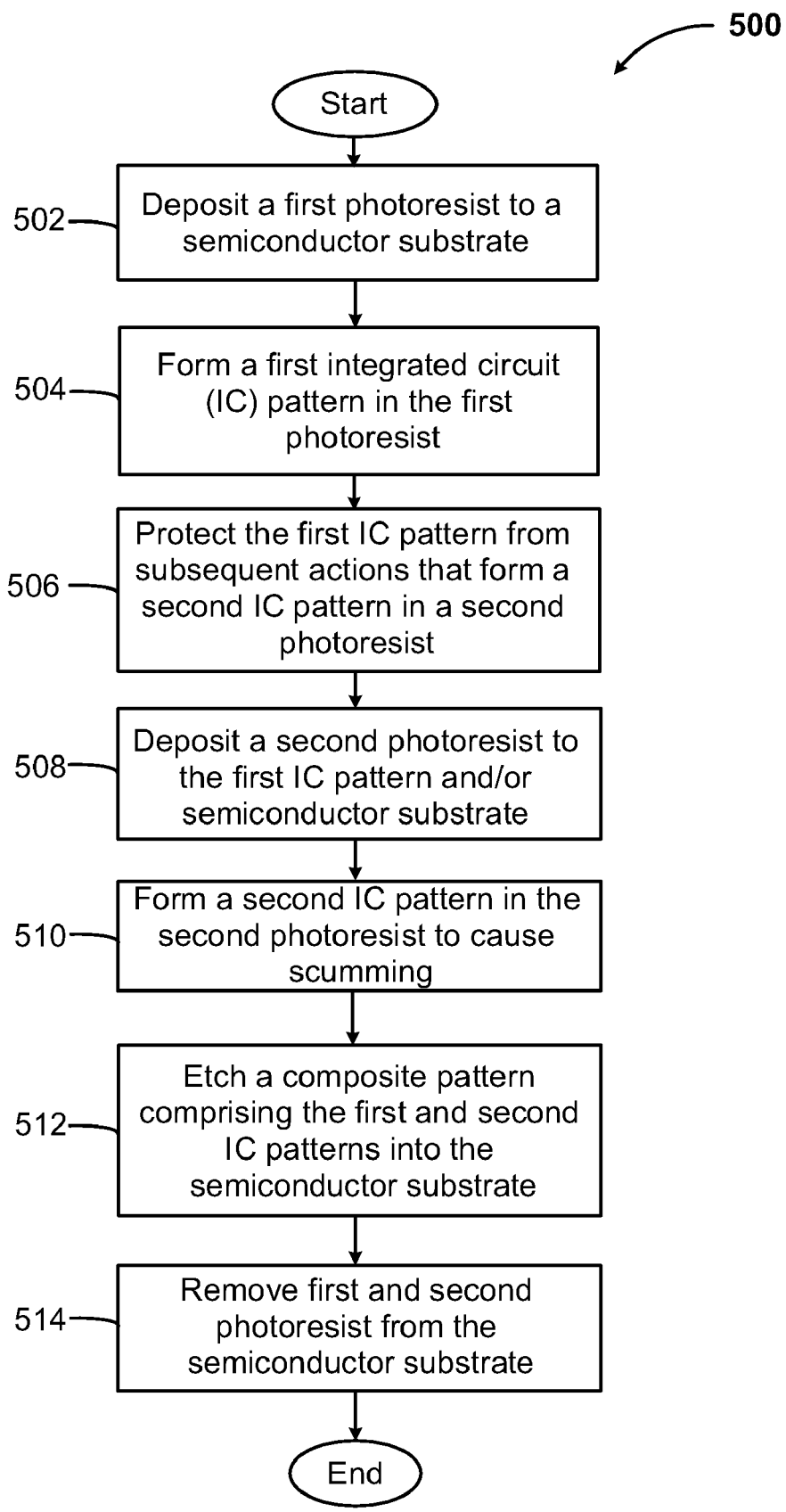
FIG. 5 is a flow diagram of a double patterning method, according to but one embodiment.

FIG. 5 is a flow diagram of a double-patterning method, according to but one embodiment. In an embodiment, a method 500 includes depositing a first photoresist to a semiconductor substrate at box 502, forming a first integrated circuit (IC) pattern in the first photoresist at box 504, protecting the first IC pattern from subsequent actions that form a second IC pattern in a second photoresist at box 506, depositing a second photoresist to the first IC pattern and/or semiconductor substrate at box 508, and forming a second IC pattern in the second photoresist to cause scumming at box 510. In another embodiment, method 500 further includes etching a composite pattern comprising the first and second IC patterns into the semiconductor substrate at box 512, and removing the first and second photoresist from the semiconductor substrate at box 514. Method 500 may incorporate embodiments already described with respect to FIGS. 1-4 in one or more embodiments.

In an embodiment, method 500 includes depositing a first photoresist to a semiconductor substrate 502 and forming a first IC pattern in the first photoresist, the first IC pattern comprising one or more trench structures 504. Forming a first IC pattern in the first photoresist 504 may comprise exposing the first photoresist to light energy to define the first IC pattern in the first photoresist and removing either the exposed or unexposed regions of the first photoresist by developer.

Method 500 may further include protecting the first IC pattern in the first photoresist from actions that form a second IC pattern in a second photoresist 506. In an embodiment, protecting the first IC pattern in the first photoresist from actions that form a second IC pattern in a second photoresist comprises making the first IC pattern in the first photoresist impervious to exposure of light energy that defines the second IC pattern in the second photoresist, or making the first IC pattern in the first photoresist insoluble to developer that removes either exposed or unexposed regions of the second photoresist, or combinations thereof. In an embodiment, a first IC pattern is made insoluble in developers comprising, for example, tetramethyl ammonium hydroxide (TMAH) and/or solvents comprising, for example, ethyl lactate, propylene glycol methyl ether acetate (PGMEA), or cyclohexanone, or combinations thereof. Other developers and/or solvents may be used in other embodiments.

Method 500 may further include depositing the second photoresist to the first IC pattern 508, and forming the second IC pattern in the second photoresist 510, the second IC pattern comprising one or more structures that are sufficiently close to the one or more trench structures of the first IC pattern to cause scumming of the second photoresist in the one or more trench structures of the first IC pattern. Forming the second IC pattern in the second photoresist 510 may comprise exposing the second photoresist to light energy to define the second IC pattern in the second photoresist and removing either the exposed or unexposed regions of the second photoresist by developer.

The scumming of the second photoresist in the one or more trench structures of the first IC pattern may allow fabrication of smaller IC structures on the semiconductor substrate than without the scumming. In an embodiment, scumming prevents the removal of one or more structures of the second IC pattern. In another embodiment, scumming anchors the one or more structures of the second IC pattern. Combinations of these effects may occur to extend the resolution capabilities of patterning equipment used to form the first and second IC patterns.

A method 500 may further include etching a composite pattern comprising the first IC pattern and the second IC pattern into the semiconductor substrate 512 to form one or more IC structures. Etching a composite pattern 512 may comprise etching a grating pattern and a line-end or trench-end structure, or a trench end-to-end or line end-to-end structure, or an attacker geometry structure, or combinations thereof, into the semiconductor substrate. In an embodiment, a method 500 further includes removing the first and second photoresist from the semiconductor substrate 512. A first IC pattern and second IC pattern may be used to form separate structures of a final composite IC pattern in an electronic device.

Figure 6:
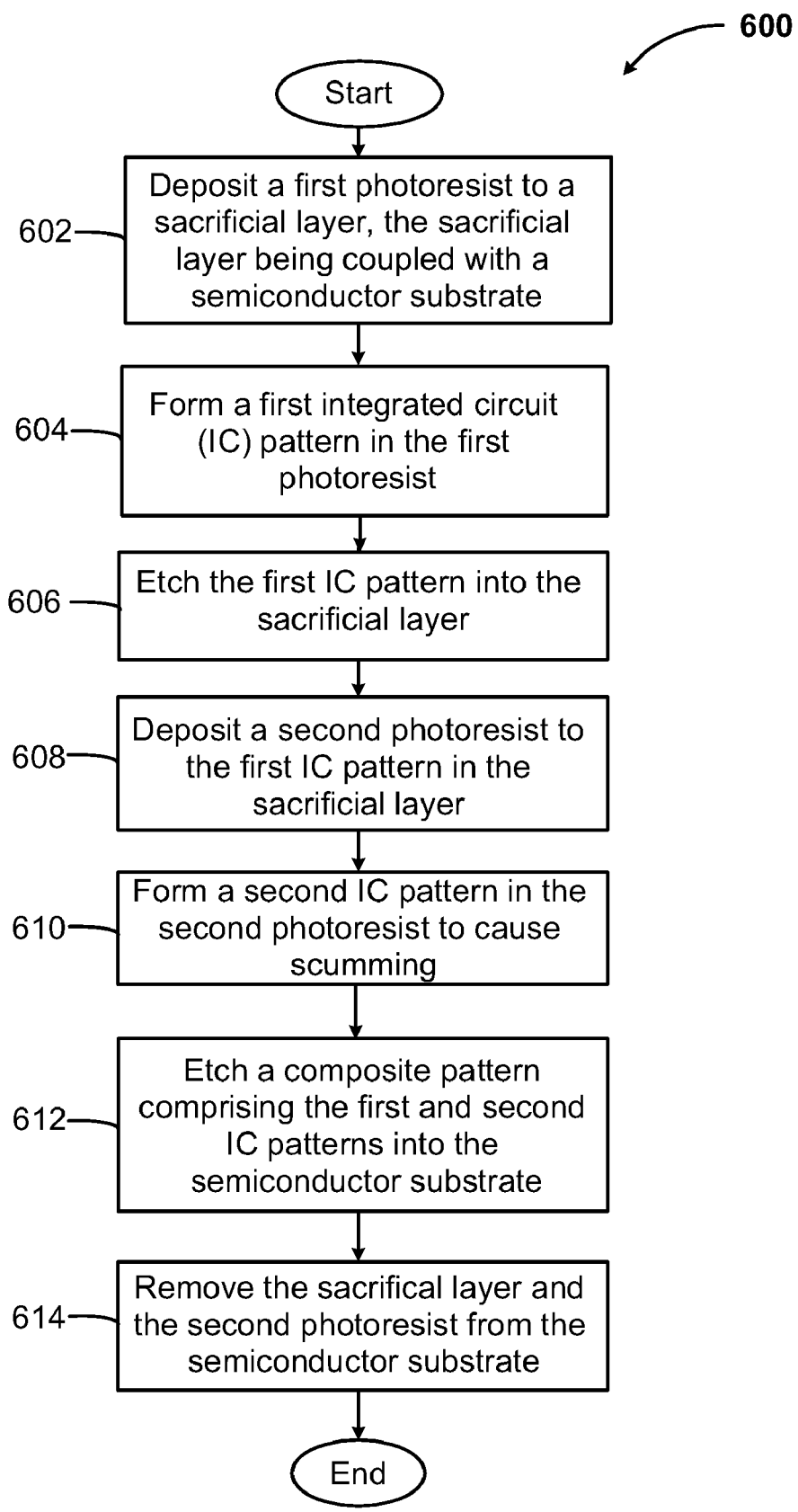
FIG. 6 is a flow diagram of another double patterning method, according to but one embodiment.

FIG. 6 is a flow diagram of another double-patterning method, according to but one embodiment. In an embodiment, a method 600 includes depositing a first photoresist to a sacrificial layer, the sacrificial layer being coupled with a semiconductor substrate at box 602, forming a first integrated circuit (IC) pattern in the first photoresist at box 604, etching the first IC pattern into the sacrificial layer at box 606, depositing a second photoresist to the first IC pattern in the sacrificial layer at box 608, and forming a second IC pattern in the second photoresist to cause scumming at box 610. In another embodiment, method 600 further includes etching a composite pattern comprising the first and second IC patterns into the semiconductor substrate at box 612 and removing the sacrificial layer and the second photoresist from the semiconductor substrate at box 614. Method 600 may include embodiments already described with respect to FIGS. 1-5 in one or more embodiments.

In an embodiment, method 600 includes depositing a first photoresist to a sacrificial layer 602, the sacrificial layer being coupled with a semiconductor substrate and forming a first integrated circuit (IC) pattern in the first photoresist 604, the first IC pattern comprising one or more trench structures. Forming a first IC pattern in the first photoresist 604 may comprise exposing the first photoresist to light energy to define the first IC pattern in the first photoresist and removing either the exposed or unexposed regions of the first photoresist by developer.

Method 600 may further include etching the first IC pattern into the sacrificial layer 606, depositing a second photoresist to the first IC pattern in the sacrificial layer 608, and forming a second IC pattern in the second photoresist 610, the second IC pattern comprising one or more structures that are sufficiently close to the one or more trench structures of the first IC pattern to cause scumming of the second photoresist in the one or more trench structures of the first IC pattern. Forming the second IC pattern in the second photoresist 610 may comprise exposing the second photoresist to light energy to define the second IC pattern in the second photoresist and removing either the exposed or unexposed regions of the second photoresist by developer. In another embodiment, forming a second IC pattern in the second photoresist 610 does not substantially alter the first IC pattern in the sacrificial layer.

The scumming of the second photoresist in the one or more trench structures of the first IC pattern may allow fabrication of smaller IC structures on the semiconductor substrate than without the scumming. In an embodiment, scumming prevents the removal of the one or more structures of the second IC pattern. In another embodiment, scumming anchors the one or more structures of the second IC pattern. Combinations of these effects may occur to extend the resolution capabilities of patterning equipment used to form the first and second IC patterns.

Method 600 may further include etching a composite pattern comprising the first IC pattern and the second IC pattern into the semiconductor substrate 612 to form one or more IC structures. Etching a composite pattern 612 may comprise etching a grating pattern and a line-end or trench-end structure, or a trench end-to-end or line end-to-end structure, or an attacker geometry structure, or combinations thereof, into the semiconductor substrate. In another embodiment, etching a composite pattern comprises an etch process that is selective to both the second photoresist and the sacrificial layer. Method 600 may further include removing the second photoresist and the sacrificial layer from the semiconductor substrate.

Various operations may be described as multiple discrete operations in turn, in a manner that is most helpful in understanding the claimed subject matter. The order of description should not, however, be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. A method, comprising:
   depositing a first photoresist on a semiconductor substrate;
   forming a first integrated circuit (IC) pattern in the first photoresist, the first IC pattern comprising one or more trench structures;
   protecting the first IC pattern in the first photoresist from actions that form a second IC pattern in a second photoresist;
   depositing the second photoresist on the first IC pattern; and
   forming the second IC pattern in the second photoresist, the second IC pattern comprising one or more structures that are sufficiently close to the one or more trench structures of the first IC pattern to mechanically anchor or buttress the second IC pattern with the first IC pattern by scumming of the second photoresist in the one or more trench structures of the first IC pattern.

2. A method according to claim 1, wherein the scumming allows the fabrication of smaller IC structures on the semiconductor substrate than without the scumming by preventing the removal of the one or more structures of the second IC pattern or by buttressing the one or more structures of the second IC pattern, or combinations thereof.

3. A method according to claim 1, further comprising:
   etching a composite pattern comprising the first IC pattern and the second IC pattern into the semiconductor substrate to form one or more IC structures that are based on the first IC pattern and the second IC pattern; and
   removing the first and second photoresist from the semiconductor substrate.

4. A method according to claim 1, wherein forming a first IC pattern in the first photoresist comprises:
   exposing the first photoresist to light energy to define the first IC pattern in the first photoresist; and
   removing either the exposed or unexposed regions of the first photoresist by developer.

5. A method according to claim 1, wherein forming the second IC pattern in the second photoresist comprises:
   exposing the second photoresist to light energy to define the second IC pattern in the second photoresist; and
   removing either the exposed or unexposed regions of the second photoresist by developer.

6. A method according to claim 1, wherein protecting the first IC pattern in the first photoresist from actions that form the second IC pattern in the second photoresist comprises making the first IC pattern in the first photoresist impervious to exposure of light energy that defines the second IC pattern in the second photoresist, or making the first IC pattern in the first photoresist insoluble to developer and solvent that removes either exposed or unexposed regions of the second photoresist, or combinations thereof.

7. A method according to claim 3, wherein etching a composite pattern comprises etching a grating pattern and a line-end or trench-end structure, or a trench end-to-end or line end-to-end structure, or an attacker geometry structure, or combinations thereof, into the semiconductor substrate.

8. A method, comprising:
   depositing a first photoresist on a sacrificial layer, the sacrificial layer being coupled with a semiconductor substrate;
   forming a first integrated circuit (IC) pattern in the first photoresist, the first IC pattern comprising one or more trench structures;
   etching the first IC pattern into the sacrificial layer;
   depositing a second photoresist on the first IC pattern in the sacrificial layer; and
   forming a second IC pattern in the second photoresist, the second IC pattern comprising one or more structures that are sufficiently close to the one or more trench structures of the first IC pattern to mechanically anchor or buttress the second IC pattern with the first IC pattern by scumming of the second photoresist in the one or more trench structures of the first IC pattern.

9. A method according to claim 8, wherein the scumming allows the creation of smaller IC structures on the semiconductor substrate than without the scumming by preventing the removal of the one or more structures of the second IC pattern or by buttressing the one or more structures of the second IC pattern, or combinations thereof.

10. A method according to claim 8, further comprising:
    etching a composite pattern comprising the first IC pattern and the second IC pattern into the semiconductor substrate to form one or more IC structures that are based on the first IC pattern and the second IC pattern; and
    removing the second photoresist and the sacrificial layer from the semiconductor substrate.

11. A method according to claim 8, wherein forming a first IC pattern in the first photoresist comprises:
    exposing the first photoresist to light energy to define the first IC pattern in the first photoresist; and
    removing either the exposed or unexposed regions of the first photoresist by developer.

12. A method according to claim 8, wherein forming the second IC pattern in the second photoresist comprises:
    exposing the second photoresist to light energy to define the second IC pattern in the second photoresist; and
    removing either the exposed or unexposed regions of the second photoresist by developer.

13. A method according to claim 10, wherein etching a composite pattern comprises etching a grating pattern and a line-end or trench-end structure, or a trench end-to-end or line end-to-end structure, or an attacker geometry structure, or combinations thereof, into the semiconductor substrate.

14. A method according to claim 10, wherein etching a composite pattern comprises an etch process that is selective to both the second photoresist and the sacrificial layer and wherein forming a second IC pattern in the second photoresist does not substantially alter the first IC pattern in the sacrificial layer.

15. An apparatus, comprising:
a semiconductor substrate; and
one or more integrated circuit (IC) structures coupled with the semiconductor substrate wherein the one or more IC structures are fabricated by at least:
depositing a first photoresist on the semiconductor substrate;
forming a first integrated circuit (IC) pattern in the first photoresist, the first IC pattern comprising one or more trench structures;
protecting the first IC pattern in the first photoresist from actions that form a second IC pattern in a second photoresist;
depositing the second photoresist on the first IC pattern; and
forming the second IC pattern in the second photoresist, the second IC pattern comprising one or more structures that are sufficiently close to the one or more trench structures of the first IC pattern to mechanically anchor or buttress the second IC pattern with the first IC pattern by scumming of the second photoresist in the one or more trench structure of the first IC pattern.

16. An apparatus according to claim 15, wherein the one or more IC structures are further fabricated by:
etching a composite pattern comprising the first IC pattern and the second IC pattern into the semiconductor substrate to form the one or more IC structures that are based on the first IC pattern and the second IC pattern; and
removing the first and second photoresist from the semiconductor substrate.

17. An apparatus according to claim 15, wherein the scumming allows the fabrication of the one or more IC structures that are relatively smaller than without the scumming by preventing the removal of the one or more structures of the second IC pattern or by buttressing the one or more structures of the second IC pattern, or combinations thereof.

18. An apparatus according to claim 15, wherein the one or more IC structures comprise a line-end or trench-end structure, a trench end-to-end or line end-to-end structure, or an attacker geometry structure, or combinations thereof.

19. An apparatus according to claim 15, wherein forming the second IC pattern in the second photoresist comprises:
exposing the second photoresist to light energy to define the second IC pattern in the second photoresist; and
removing either the exposed or unexposed regions of the second photoresist by developer.

20. An apparatus according to claim 15, wherein protecting the first IC pattern in the first photoresist from actions that form the second IC pattern in the second photoresist comprises making the first IC pattern in the first photoresist impervious to exposure of light energy that defines the second IC pattern in the second photoresist, or making the first IC pattern in the first photoresist insoluble to developer that removes either exposed or unexposed regions of the second photoresist, or combinations thereof.

* * * * *